(12) United States Patent
Iyoda

(10) Patent No.: US 11,706,873 B2
(45) Date of Patent: Jul. 18, 2023

(54) METHOD FOR MANUFACTURING MULTILAYER WIRING SUBSTRATE

(71) Applicant: IBIDEN CO., LTD., Gifu (JP)

(72) Inventor: Shigeto Iyoda, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/494,318

(22) Filed: Oct. 5, 2021

(65) Prior Publication Data

US 2022/0110215 A1 Apr. 7, 2022

(30) Foreign Application Priority Data

Oct. 6, 2020 (JP) ................................. 2020-169398

(51) Int. Cl.
*H05K 3/06* (2006.01)
(52) U.S. Cl.
CPC .................... *H05K 3/061* (2013.01)
(58) Field of Classification Search
CPC ............... H05K 3/061; H05K 3/4679; H05K 2201/09918; Y10T 29/49155; Y10T 29/49165; H01L 2223/54426; H01L 21/4857; H01L 23/49822; H01L 23/544
USPC .................................................. 29/846, 852
See application file for complete search history.

(56) References Cited

U.S. PATENT DOCUMENTS

| | | | | |
|---|---|---|---|---|
| 8,186,050 B2* | 5/2012 | Ikawa | .................. | H05K 3/4679 29/830 |
| 9,420,708 B2* | 8/2016 | Hibino | ................. | H05K 3/4608 |
| 2015/0373833 A1* | 12/2015 | Baek | .................... | H05K 3/4682 29/846 |
| 2016/0095215 A1* | 3/2016 | Furutani | .............. | H05K 1/0265 216/13 |

FOREIGN PATENT DOCUMENTS

JP 2000-223833 A 8/2000

* cited by examiner

*Primary Examiner* — Donghai D Nguyen
(74) *Attorney, Agent, or Firm* — Oblon, McClelland, Maier & Neustadt, L.L.P.

(57) ABSTRACT

A method for manufacturing a multilayer wiring substrate includes forming a resist layer having mask pattern, forming a conductor layer having conductor pattern using the resist layer, removing the resist layer, forming an insulating layer on the conductor layer such that the insulating layer is laminated on the conductor layer, forming a subsequent resist layer having mask pattern such that the subsequent resist layer is formed on the insulating layer, and forming a subsequent conductor layer having conductor pattern using the subsequent resist layer. The forming of the resist layer includes conducting first correction in which formation position of entire mask pattern of the resist layer is corrected with respect to reference position, and conducting second correction in which shape of the mask pattern of the resist layer is corrected with respect to reference shape, and the forming of the subsequent resist layer does not include conducting the second correction.

20 Claims, 9 Drawing Sheets

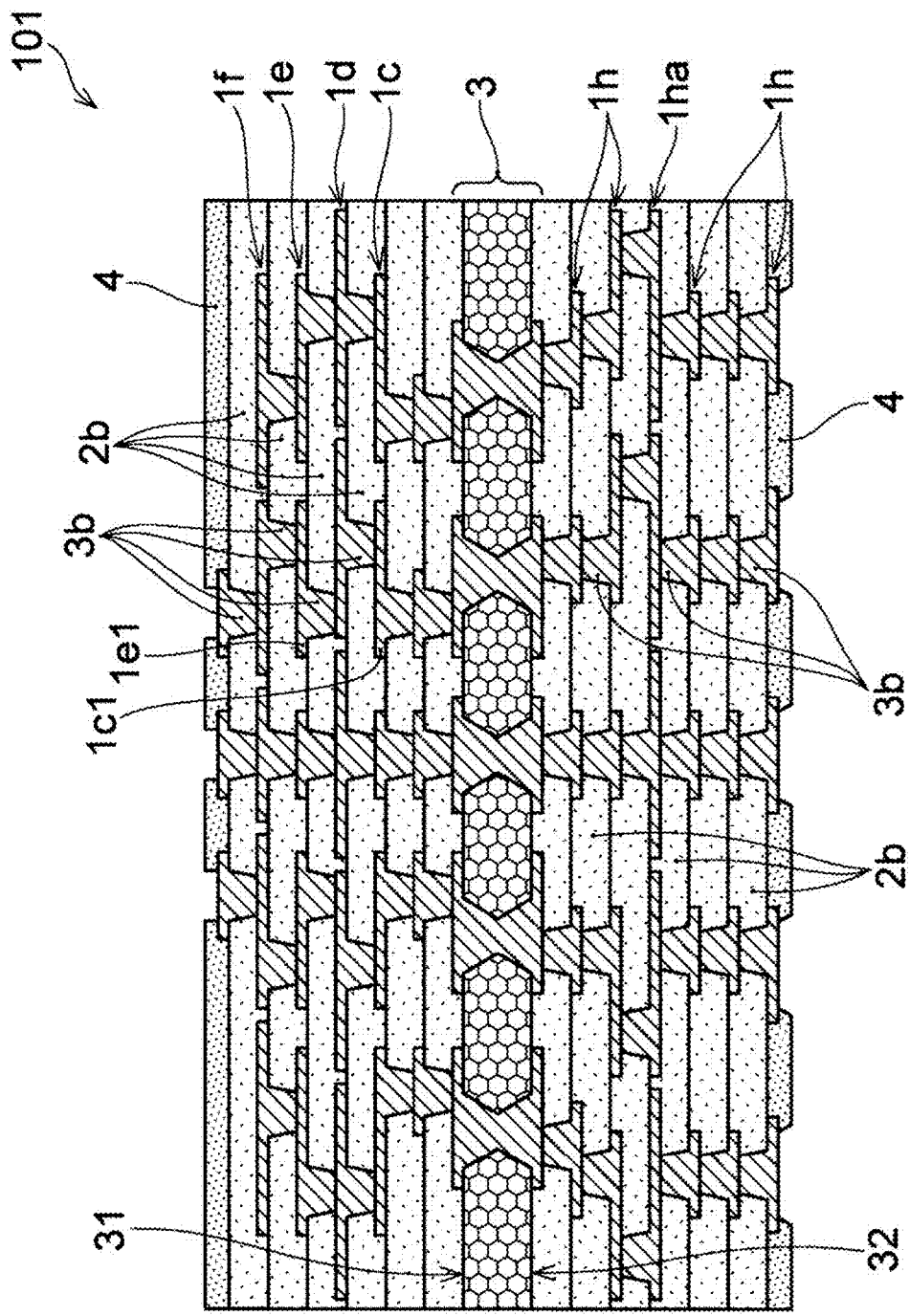

METHOD FOR MANUFACTURING MULTILAYER WIRING SUBSTRATE

CROSS-REFERENCE TO RELATED APPLICATIONS

The present application is based upon and claims the benefit of priority to Japanese Patent Application No. 2020-169398, filed Oct. 6, 2020, the entire contents of which are incorporated herein by reference.

BACKGROUND OF THE INVENTION

Field of the Invention

The present invention relates to a method for manufacturing a multilayer wiring substrate.

Description of Background Art

Japanese Patent Application Laid-Open Publication No. 2000-223833 describes a method for manufacturing a multilayer printed wiring board in which a pattern layer is formed by using an exposure mask. In the method of Japanese Patent Application Laid-Open Publication No. 2000-223833, a dimension correction amount of the exposure mask with respect to shrinkage of a substrate is determined based on a spacing between via holes provided in an interlayer material layer below each pattern layer. A pattern layer is formed using an exposure mask manufactured by using this correction amount. The entire contents of this publication are incorporated herein by reference.

SUMMARY OF THE INVENTION

According to one aspect of the present invention, a method for manufacturing a multilayer wiring substrate includes forming a resist layer having a mask pattern, forming a conductor layer having a conductor pattern using the resist layer having the mask pattern, removing the resist layer from the conductor layer having the conductor pattern, forming an insulating layer on the conductor layer such that the insulating layer is laminated on the conductor layer having the conductor pattern, forming a subsequent resist layer having a mask pattern such that the subsequent resist layer is formed on the insulating layer, and forming a subsequent conductor layer having a conductor pattern using the subsequent resist layer having the mask pattern. The forming of the resist layer includes conducting a first correction in which a formation position of an entire mask pattern of the resist layer is corrected with respect to a reference position, and conducting a second correction in which a shape of the mask pattern pf the resist layer is corrected with respect to a reference shape, and the forming of the subsequent resist layer does not include conducting the second correction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 8 is a cross-sectional view illustrating another example of a multilayer wiring substrate manufactured using a method for manufacturing a multilayer wiring substrate according to an embodiment of the present invention.

DETAILED DESCRIPTION OF THE EMBODIMENTS

Figure 1:
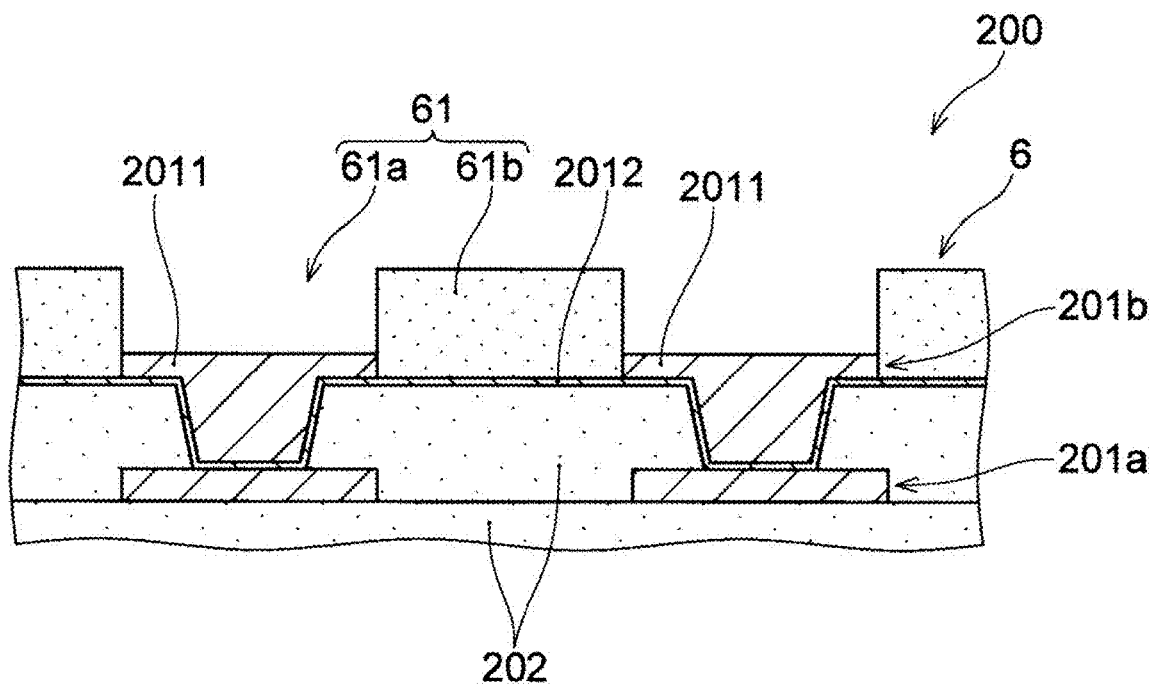
FIG. 1 illustrates a partial cross-sectional view of a multilayer wiring substrate during a manufacturing process in a method for manufacturing a multilayer wiring substrate according to an embodiment of the present invention.

Embodiments will now be described with reference to the accompanying drawings, wherein like reference numerals designate corresponding or identical elements throughout the various drawings.

A method for manufacturing a multilayer wiring substrate of an embodiment of the present invention is described with reference to the drawings.

FIG. 1 illustrates a partial cross-sectional view of a multilayer wiring substrate 200 during a manufacturing process according to the method for manufacturing a multilayer wiring substrate of the embodiment. The method for manufacturing a multilayer wiring substrate of the present embodiment includes forming multiple conductor layers (201a, 201b) by laminating the conductor layers (201a, 201b) via insulating layers 202. Forming the multiple conductor layers (201a, 201b) includes, in the formation of each of the multiple conductor layers: forming a resist layer 6 having a mask pattern 61 including predetermined opening parts (61a) and shielding parts (61b); and forming conductor patterns 2011 using the resist layer 6 (a portion of a metal film 2012 of the conductor layer (201b) covered by the resist layer 6 is removed after the resist layer 6 is removed). The mask pattern 61 is formed, for example, by selectively exposing and then developing resist film containing a photosensitive resin.

FIG. 1 illustrates an example in which the conductor layer (201b) is formed using a semi-additive method. Therefore, for example, the conductor patterns 2011 are formed by forming a plating film in the opening parts (61a) of the resist layer 6 (plating resist layer) by electrolytic plating. It is also possible that the conductor layer (201b) is formed using a subtractive method. In this case, the conductor patterns can be formed by removing conductors exposed in opening parts of a resist layer (etching resist layer).

In the present embodiment, forming the resist layer 6 includes correcting a position and a shape of a reference for the mask pattern 61. Specifically, forming the resist layer 6 includes: performing a first correction in which a formation position of the entire mask pattern 61 is corrected with respect to a predetermined reference position; and performing a second correction in which a shape of the mask pattern 61 is corrected with respect to a predetermined reference shape. In order to properly form the conductor patterns 2011, in the formation of the resist layer 6 used in the formation of the conductor patterns 2011, the position or the shape of the mask pattern 61 (the opening parts (61a) and the shielding parts (61b)) is corrected by the first correction and the second correction. The first correction and the second correction are described below.

Figure 2:
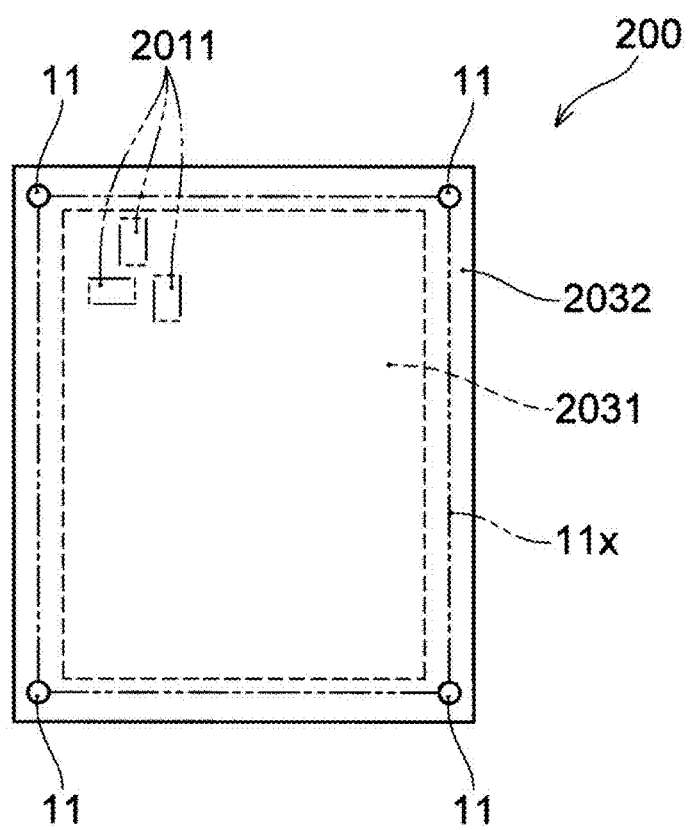
FIG. 2 is a plan view illustrating an example of reference patterns used in a method for manufacturing a multilayer wiring substrate according to an embodiment of the present invention.

FIG. 2 schematically illustrates a plan view of the multilayer wiring substrate 200 during a manufacturing process. The multilayer wiring substrate 200 of FIG. 2 includes a product region 2031, which forms the multilayer wiring substrate at the time of completion, and a margin region 2032, which is provided on an outer side of the product region 2031 and is to be removed at the time of completion. FIG. 2 illustrates four reference patterns 11 formed in the conductor layer (201a) of FIG. 1. The reference patterns 11 are respectively formed at four corners of the margin region 2032 of the multilayer wiring substrate 200 during a manufacturing process. In the example of FIG. 2, the four reference patterns 11 are provided such that a quadrangle formed by lines (11x) connecting adjacent reference patterns 11 is a rectangle or a square. It is also possible that the reference patterns 11 are provided in the product region 2031.

Figure 3A:
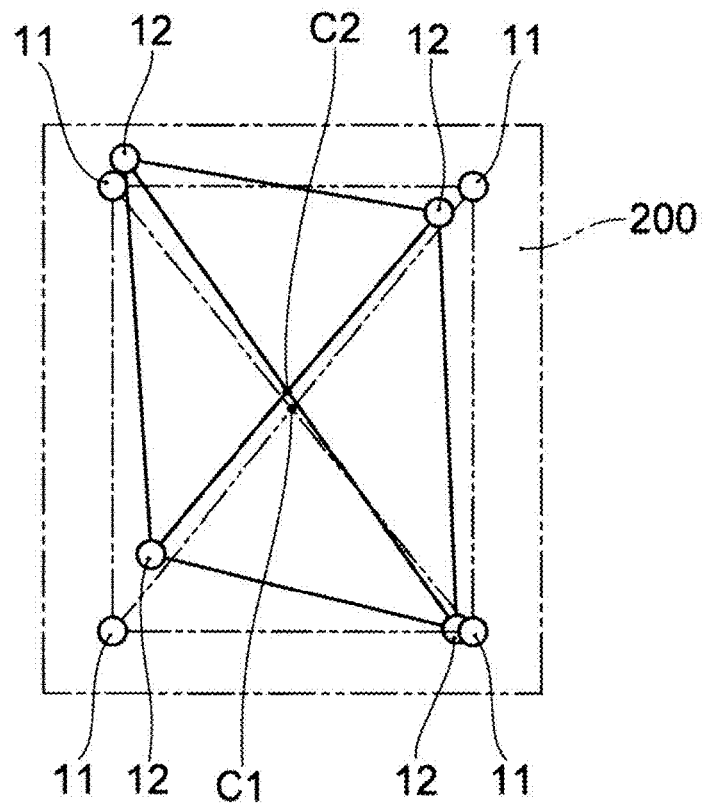
FIG. 3A illustrates an example of reference patterns to be understood in a method for manufacturing a multilayer wiring substrate according to an embodiment of the present invention.
Figure 3B:
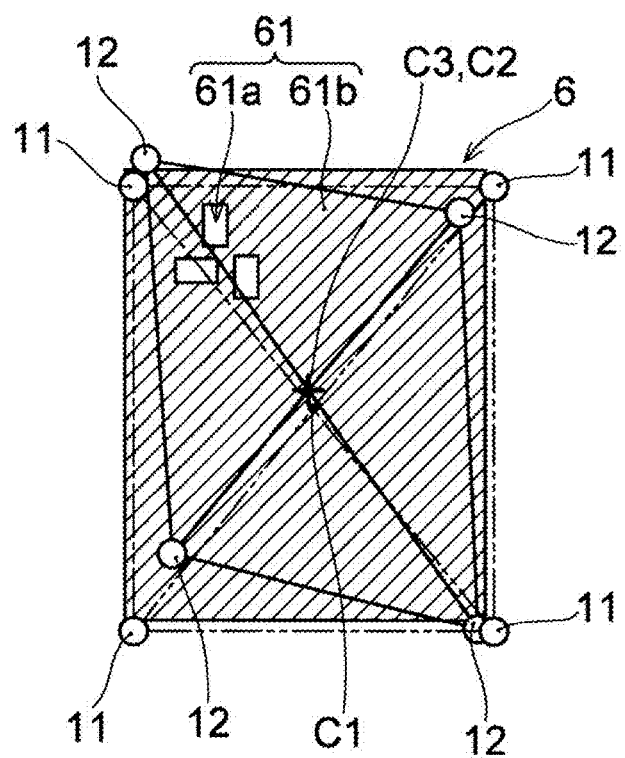
FIG. 3B conceptually illustrates an example of a first correction in a method for manufacturing a multilayer wiring substrate according to an embodiment of the present invention.
Figure 3C:
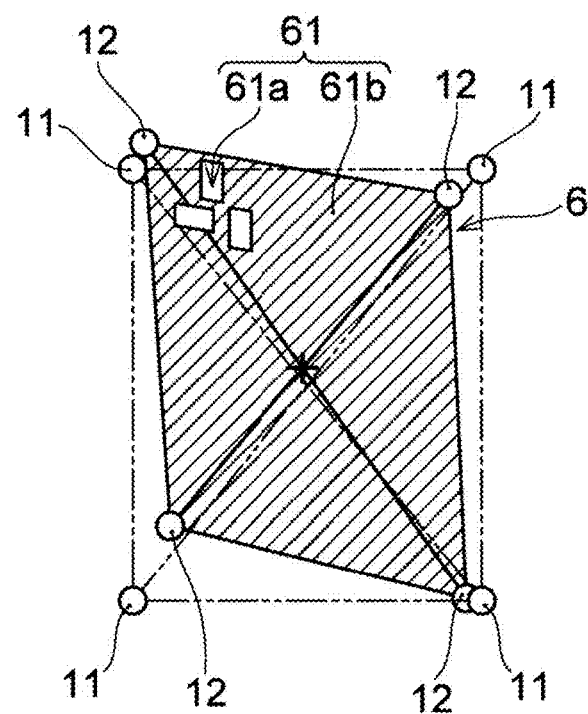
FIG. 3C conceptually illustrates an example of a second correction in a method for manufacturing a multilayer wiring substrate according to an embodiment of the present invention.

As in the example of FIG. 1, an insulating layer 202 is laminated on the conductor layer (201a) including the reference patterns 11, and the conductor layer (201b) is formed on the insulating layer 202. FIG. 2 illustrates an example of the conductor patterns 2011 formed in the conductor layer (201b) using two-dot chain lines. The first correction and the second correction described above are performed such that the conductor patterns 2011 are properly formed. For example, as illustrated in FIGS. 3A-3C, the first correction and the second correction are performed using recognition marks such as the reference patterns 11. The first correction and the second correction of the present embodiment are described with reference to FIGS. 3A-3C using as an example the correction of the mask pattern 61 performed in the formation of the conductor layer (201b) of FIG. 1 using the reference patterns 11.

FIG. 3A illustrates an example of a situation that can occur in recognizing positions of the reference patterns 11 that can be used for the first and second corrections. As illustrated in FIG. 3A, the positions of the reference patterns 11 are understood using an X-ray camera (not illustrated in the drawings) or the like. In this case, when positions of the conductor patterns of the conductor layer (for example, the conductor layer (201a)) including the reference patterns 11 deviate from original positions in design, or when the multilayer wiring substrate 200 during a manufacturing process is warped, the reference patterns 11 may not be read at their original positions. For example, the reference patterns 11 may be read at positions deviated from the original positions of the reference patterns 11, such as at positions of reference patterns 12 illustrated in FIG. 3A (hereinafter, the reference patterns actually read at the shifted positions are also referred to as "reference patterns 12"). A center of the four reference patterns 11 shifts from an original center (C1) to a center (C2) identified from the four reference patterns 12.

In such a case, as illustrated in FIGS. 3B and 3C, in the formation of the resist layer 6, the position or the shape of the mask pattern 61 is corrected by the first correction and the second correction. FIG. 3B illustrates the first correction. The mask pattern 61 illustrated in FIG. 3B includes the opening parts (61a) and the shielding parts (61b) corresponding to the conductor patterns 2011 illustrated in FIG. 1. In FIG. 3B (and FIG. 3C), the shielding parts (61b) are hatched for ease of understanding.

As illustrated in FIG. 3B, in the first correction, the formation position of the entire mask pattern 61 is corrected with respect to the predetermined reference position such that a center (C3) of the mask pattern 61 indicated by a cross mark coincides with the center (C2) of the reference patterns 12. That is, the first correction is a correction that compensates for the deviations of the four reference patterns 11 from the original positions in design by the same distance in the same direction. In other words, the first correction is an adjustment performed during the formation of the resist layer 6 to compensate for a deviation of all conductor patterns of an immediately previously formed conductor layer (for example, the conductor layer (201a)) from an original position.

In the case where "the position of the entire mask pattern" is represented by the center (C3) of the mask pattern 61, the "predetermined reference position" is the center (C1) of the four reference patterns 11 formed at the original positions as designed. Further, "the entire mask pattern" is a region that overlaps with the product region 2031 (see FIG. 2) in the resist layer 6. In the first correction, as illustrated in FIG. 3B, the shape of the mask pattern 61, that is, the shapes of the opening parts (61a) and the shielding parts (61b), cannot be changed.

In the method for manufacturing a multilayer wiring substrate of the present embodiment, further, as illustrated in FIG. 3C, in the formation of the resist layer 6, the second correction is performed in which the shape of the mask pattern 61 is corrected with respect to the predetermined reference shape. "Correcting the shape of the mask pattern 61" includes changing a shape and/or a size of each of the opening parts (61a) and the shielding parts (61b). The "reference shape" is the shape of the mask pattern 61 to be provided in the resist layer 6 when the multilayer wiring substrate in a manufacturing process is not warped or bent. That is, the second correction is a correction that compensates for deviations of the four reference patterns 11 from their original positions, which are caused by warpage, bending, or the like and are not necessarily in the same direction and of the same distance. In other words, the second correction is an adjustment performed during the formation of the resist layer 6 to compensate for deviations from the original positions that differ from each other depending on a place in an immediately previously formed conductor layer (for example, the conductor layer (201a)).

For example, based on the positions of the reference patterns 12, a function is identified that replaces coordinates in a rectangle with the four original reference patterns 11 as vertices with coordinates in a quadrangle with the four reference patterns 12 as vertices (hereafter, this function is also simply referred to as the "function"). According to the function, for example, coordinates of each vertex of the opening parts (61a) are converted to coordinates of a position where it is to be actually positioned. That is, the function specifies a correction amount for each coordinate in the mask pattern 61. Then, the second correction is performed by forming the opening parts (61a) and the shielding parts (61b) based on the specified correction amount. In this way, performing the second correction may include determining a correction amount for each position in the mask pattern 61 based on the positions of the multiple reference patterns 11. That is, performing the second correction can include partially extending or contracting the mask pattern 61 relative to the "reference shape" by a correction amount determined according to a position in the mask pattern 61.

As illustrated in FIG. 3C, the opening parts (61a) formed through the second correction may be deformed, enlarged or reduced with respect to the "reference shape" (for example, the shapes of the opening parts (61a) illustrated in FIG. 3B) without performing the second correction. Therefore, performing the second correction can include correcting the shapes of the opening parts (61a) with respect to the predetermined reference shape.

By forming the resist layer by performing the first correction and the second correction, for example, it may be possible to suppress positional deviations of the conductor patterns of the conductor layer (201b) with respect to conductor patterns of an immediately previously formed lower-layer conductor layer (for example, the conductor layer (201a)).

Figure 4:
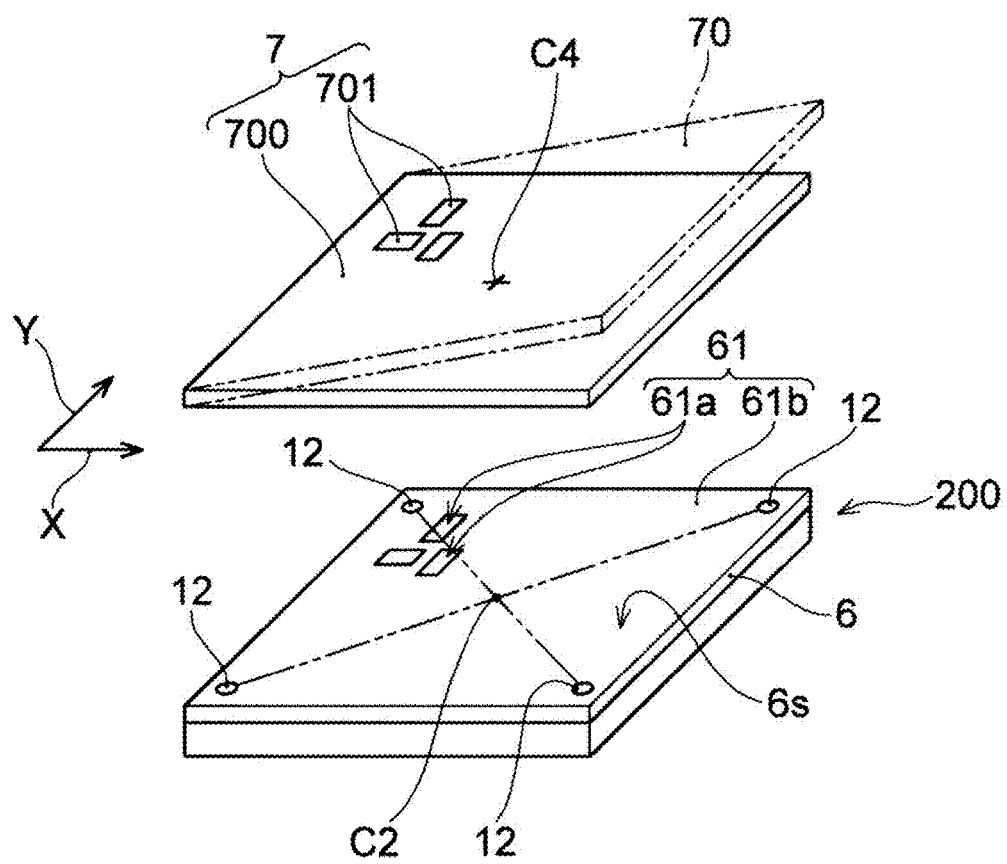
FIG. 4 is a perspective view illustrating an example of a correction using an exposure mask in a method for manufacturing a multilayer wiring substrate according to an embodiment of the present invention.

FIG. 4 illustrates an example in which the first correction and the second correction are performed using an exposure mask 7. The reference patterns 12 that are actually understood using an X-ray camera (not illustrated in the drawings) or the like on a surface of the multilayer wiring substrate 200 during a manufacturing process are illustrated. The exposure mask 7 has a light-transmitting region 700 and a light-shielding region 701. In the first correction, the exposure mask 7 is aligned with the multilayer wiring substrate 200 in both an X direction and a Y direction such that the center (C2) identified from the positions of the four reference patterns 12 and a center (C4) of the exposure mask 7 match each other.

On the other hand, in the second correction, for example, a distance between the exposure mask 7 and the resist layer 6 is adjusted. By moving the exposure mask 7 closer to the resist layer 6, a region irradiated with light transmitted through the light-transmitting region 700 can be enlarged. Conversely, by moving the exposure mask 7 away from the resist layer 6, the irradiated region can be reduced. Further, by tilting the exposure mask 7 with respect to an irradiated surface (6s) of the resist layer 6, an enlargement ratio or a reduction ratio of the irradiated region can be changed in a specific direction. That is, performing the second correction may include tilting the exposure mask 7 with respect to the irradiated surface (6s) of the resist film forming the resist layer 6 when the resist film is irradiated with light.

For example, by tilting the exposure mask 7 indicated by a two-dot chain line in FIG. 4 such that a distance relative to the resist layer 6 is changed along the X direction, the enlargement rate or the reduction rate of the irradiated region can be changed in the X direction. Further, by tilting the exposure mask 7 in both the X direction and the Y direction, the enlargement ratio or the reduction ratio of the irradiated region can be changed in both the directions. Further, by tilting the exposure mask 7 at mutually different angles in the X direction and the Y direction, the enlargement ratio or the reduction ratio of the irradiated region can be changed along the X direction and the Y direction while being mutually different in the X direction and the Y direction.

In this way, the second correction may be performed by adjusting the distance or angle between the exposure mask 7 and the irradiated surface (6s) of the resist layer 6. That is, the distance or angle between the exposure mask 7 and the resist layer 6 may be selected such that vertices or the like of the opening parts (61a) and the shielding parts (61b) as the entire resist layer 6 are positioned as close as possible to coordinates derived by the above-described function.

The mask pattern 61 may be formed using a direct imaging method, in which a laser beam having an appropriate spot diameter is directly irradiated toward an exposed portion (for example, the shielding parts (61b)) of the resist layer 6, without using the exposure mask 7. In this case, the laser is irradiated toward an exposed portion after correction identified by the first correction and the second correction.

Figure 5:
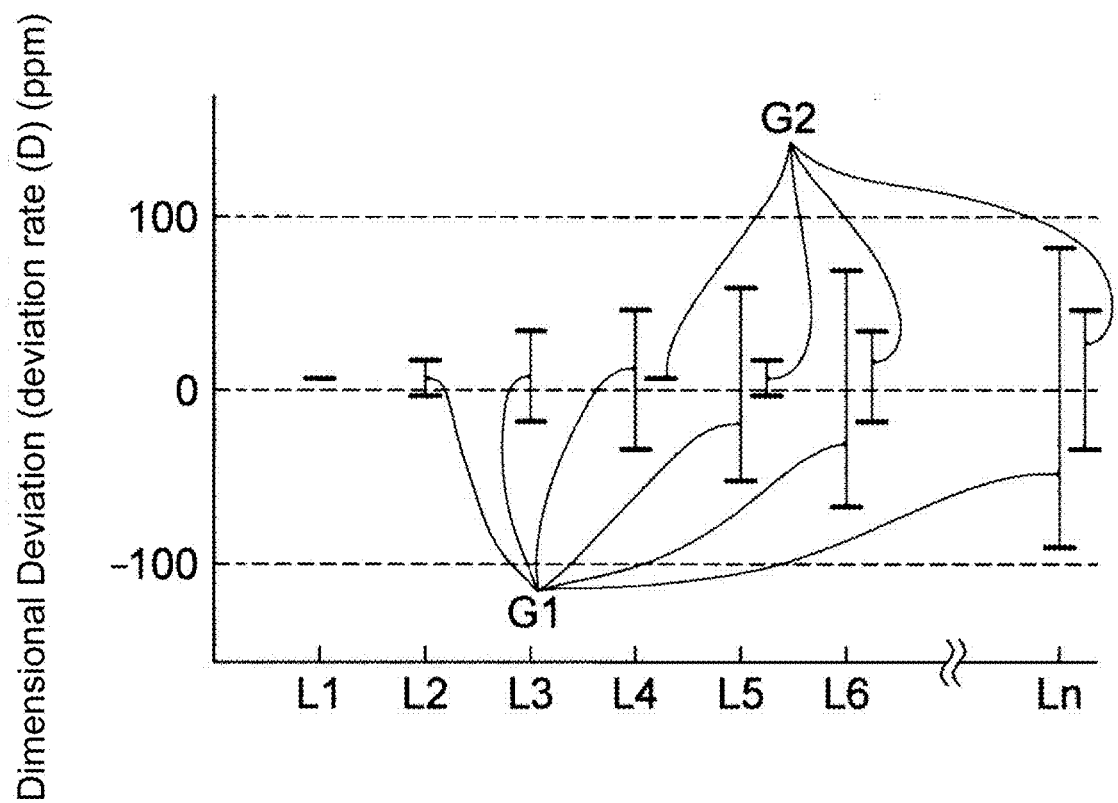
FIG. 5 shows an example of changes in variation of layers due to a method for manufacturing a multilayer wiring substrate according to an embodiment of the present invention.

As described with reference to FIGS. 1-4, in the method for manufacturing a multilayer wiring substrate of the present embodiment, in the formation of the resist layer 6 in the formation of each of the multiple conductor layers (for example, the conductor layers (201a, 201b)), the first correction and the second correction are performed. It is considered that, by performing the second correction, conductor patterns are formed with less positional deviations with respect to conductor patterns of an immediately previously formed lower-layer conductor layer as compared to a case where only the first correction is performed. However, in the manufacture of the multilayer wiring substrate, when the second correction is performed in the formation of all the multiple conductor layers, for a later formed conductor layer, variation in dimensions of an actually formed conductor pattern with respect to original dimensions in design may be larger. Here, the "dimensions of a conductor pattern" are, for example, a length, a width, or a diameter of a conductor pad, a wiring width or a wiring interval, and the like. A deviation of dimensions of a conductor pattern actually formed in a conductor layer with respect to original dimensions in design is also referred to hereinafter simply as a "dimensional deviation" of the conductor layer. With reference to FIG. 5, an increase in variation in the dimensional deviations of the conductor layers as the layers are laminated is described.

FIG. 5 illustrates an example of variations in dimensional deviations of conductor layers from an innermost conductor layer (first layer: L1), which is formed first, to an outermost conductor layer (nth layer: Ln) in the manufacture of the multilayer wiring substrate. Specifically, FIG. 5 shows an example of a distribution of deviations of measured values with respect to design values obtained by measuring spacings between the reference patterns 11 (see FIG. 2) in the conductor layers for multiple multilayer wiring substrates. A deviation rate (D) (=((measured value)−(design value))/(design value)) is used to indicate a deviation of a measured value with respect to a design value. A length of a vertical line shown for each of the conductor layers (L1-Ln) in a horizontal axis direction indicates a magnitude of variation in the deviation rate (D), that is, a magnitude of variation in the dimensional deviation in each of the conductor layers.

The conductor layers from the first layer (L1) to the nth layer (Ln) shown in FIG. 5 are laminated in an order from the first layer (L1) to the nth layer (Ln) via insulating layers. And, among the conductor layers from the second layer (L2) to the nth layer (Ln), the ith conductor layer is formed using a resist layer that is formed through the first correction and the second correction based on reference patterns (for example, the reference patterns 11 of FIG. 2) formed on the (i−1)th conductor layer. On the other hand, in the formation of the first layer (L1) for which a previously formed conductor layer does not exist, only the first correction is performed based on, for example, reference holes or the like provided in an underlying insulating layer, and a mask pattern is formed along the above-described "reference shape" without performing the second correction.

As shown in a variation group (G1) in FIG. 5, variation in dimensional deviation substantially does not occur in the first layer (L1) for which the second correction is not performed when the first layer (L1) is formed. However, variation occurs from the second layer (L2) to the nth layer (Ln), and increases in magnitude as the layers are laminated.

It is considered that the increase in variation shown in the variation group (G1) is due to that a correction amount of the second correction accumulates each time a layer is laminated. And, a tendency that such as correction amount accumulates is considered to be related to that a type of correction such as enlargement or reduction in the second correction tends to be the same among the formations of the multiple conductor layers. More specifically, the second correction can be performed, for example, based on reference patterns of an immediately previously formed conductor layer. And, since the reference patterns are displaced due to warpage or bending of the multilayer wiring substrate during a manufacturing process, displacement directions of the reference patterns tend to be the same for the conductor layers. Therefore, the types of the second correction (directions of enlargement or reduction, and/or extension or contraction direction, and the like) tend to be the same for the formations of the conductor layers. As a result, the correction amount tends to increase cumulatively with each lamination, and as a result, the variation in the dimensional deviation of the conductor layers increases.

The increase in the variation in the dimensional deviation of the conductor layers as illustrated in the variation group (G1) of FIG. 5 may cause conductor patterns to be formed that exceed in allowable values of sizes or spacings of conductor patterns in a conductor layer formed on an outer-layer side. In particular, since it is easy to form minute-sized mounting pads or wiring patterns formed at a fine pitch in an outermost conductor layer, an increase in the variation in the dimensional deviation of the conductor layer tends to be a problem.

Therefore, in the method for manufacturing a multilayer wiring substrate of the present embodiment, not only for the conductor layer that is formed first, the resist layer used in forming conductor patterns of a specific layer, which is one of the second and subsequent conductor layers among the multiple conductor layers, is also formed without performing the second correction. Therefore, as shown by a variation group (G2) in FIG. 5, variation in dimensional deviation in the specific layer (the fourth layer (L4) in FIG. 5) substantially does not occur, that is, the accumulation of correction amounts up to the third layer (L3) is canceled. After that, since the second correction is performed from the fifth layer (L5), variation in dimensional deviation of the conductor layers also increases in the variation group (G2). However, even in the outermost nth layer (Ln), the size of the variation is smaller than that when the second correction is performed in the formation of all the conductor layers (the variation group (G1)).

In this way, in the present embodiment, in the formation of the multiple conductor layers, by providing the specific layer for which the second correction is not performed, the variation in dimensional deviation in the conductor layers formed after the specific layer can be suppressed. On the other hand, in the formation of the conductor layers other than the specific layer, both the first correction and the second correction are performed, and thus, appropriate conductor patterns according to deviations of conductor patterns of an immediately previously formed conductor layer can be formed. Therefore, according to the present embodiment, it is considered that a multilayer wiring substrate in which appropriately formed conductor patterns are included in each conductor layer can be manufactured.

Figure 6:
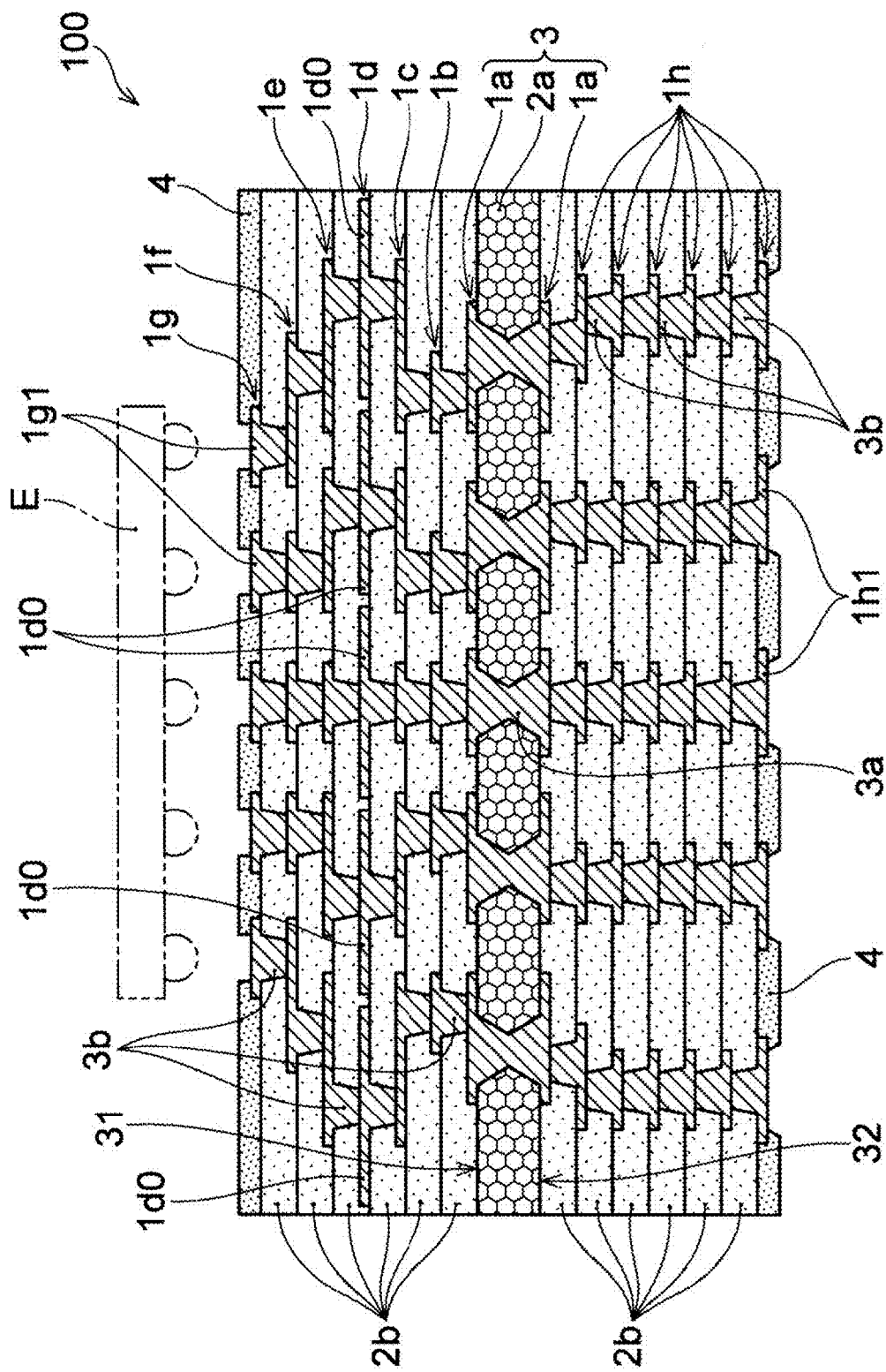
FIG. 6 is a cross-sectional view illustrating an example of a multilayer wiring substrate manufactured using a method for manufacturing a multilayer wiring substrate according to an embodiment of the present invention.

The method for manufacturing a multilayer wiring substrate of the present embodiment is further described using a more specific example. FIG. 6 illustrates a cross-sectional view of a multilayer wiring substrate 100, which is an example of a multilayer wiring substrate manufactured using the method for manufacturing a multilayer wiring substrate of the embodiment (the multilayer wiring substrate 100 is also simply referred to as the wiring substrate 100). As illustrated in FIG. 6, the wiring substrate 100 includes a core substrate 3, and insulating layers and conductor layers that are alternately laminated on two main surfaces (a first surface 31 and a second surface 32) of the core substrate 3 opposing each other in a thickness direction of the core substrate 3.

The core substrate 3 includes an insulating layer (2a), and conductor layers (1a) that are respectively formed on both sides of the insulating layer (2a). On the first surface 31 of the core substrate 3, conductor layers (1b-1g) are each formed via an insulating layer (2b). On the second surface 32 of the core substrate, six conductor layers (1h) are each laminated via an insulating layer (2b). In the insulating layer (2a), through-hole conductors (3a) that connect to each other the conductor layer (1a) on the first surface 31 side and the conductor layer (1a) on the second surface 32 side are formed. In each insulating layer (2b), via conductors (3b) that connect to each other the conductor layers sandwiching the insulating layer (2b) are formed.

The conductor layers (1a-1h) each include predetermined conductor patterns. The conductor layer (1g) (surface-layer conductor layer), which is an outermost conductor layer on the first surface 31 side of the core substrate 3, includes multiple mounting pads (1g1) to be connected to an electronic component (E). Examples of the electronic component (E) include active components such as semiconductor integrated circuit devices and transistors, and passive components such as chip resistors and chip capacitors. The electronic component (E) may be a semiconductor integrated circuit device (semiconductor chip) in a bare chip state. On the other hand, the outermost conductor layer (1h) among the six conductor layers (1h) on the second surface 32 side of the core substrate 3 includes connection pads (1h1) to be connected to an external element (not illustrated in the drawings) of the wiring substrate 100. The external element (not illustrated in the drawings) is, for example, a wiring substrate (motherboard) on which the wiring substrate 100 is to be mounted.

In the wiring substrate 100 of the example of FIG. 6, the conductor layer (1d) includes a conductor pattern (1d0) that is used as a ground plane or a power supply plane when the wiring substrate 100 is in use. That is, the conductor pattern (1d0) can be electrically connected to a power supply or ground of a device (not illustrated in the drawings) in which the wiring substrate 100 is used when the wiring substrate 100 is in use. In the wiring substrate 100 of FIG. 1, the conductor layer (1d) is the above-described specific layer that is formed using the resist layer formed without performing the second correction. The conductor pattern (1d0) may be a so-called solid pattern that extends in multiple directions over a predetermined region. Therefore, the conductor pattern (1d0) may be larger than the largest conductor pattern among the conductor patterns formed in the conductor layers (1a-1h) other than the conductor layer (1d).

A solder resist 4 is formed on the outermost conductor layer (1g or 1h) and on the outermost insulating layer (2b) on each of the first surface 31 side and the second surface 32 side of the core substrate 3. Openings exposing the mounting pads (1g1) or the connection pads (1h1) are formed in the solder resist 4.

The conductor layers (1a-1h), the through-hole conductors (3a), and the via conductors (3b) can be formed of any conductor with appropriate conductivity, such as a metal, for example, copper, nickel, or the like. The conductor layers are illustrated in a simplified manner in FIG. 6, and can each have a laminated structure that includes a metal foil, an electroless plating film or a sputtering film, an electrolytic plating film, and the like. The through-hole conductors (3a) and the via conductors (3b) can also each have a laminated structure that includes an electroless plating film or a sputtering film, and an electrolytic plating film.

The insulating layers (2a, 2b) are each formed of any insulating resin. Examples of the insulating resin include an epoxy resin, a bismaleimide triazine resin (BT resin), a phenol resin, and the like. The insulating layers may each contain a core material (reinforcing material) (not illustrated in the drawings) formed of a glass fiber, an aramid fiber, or the like. The insulating layers can each further contain inorganic filler (not illustrated in the drawings) formed of fine particles of silica ($SiO_2$), alumina, mullite, or the like.

The method for manufacturing a multilayer wiring substrate of the embodiment is described with reference to FIGS. 7A-7G using the wiring substrate 100 illustrated in FIG. 6 as an example.

Figure 7A:
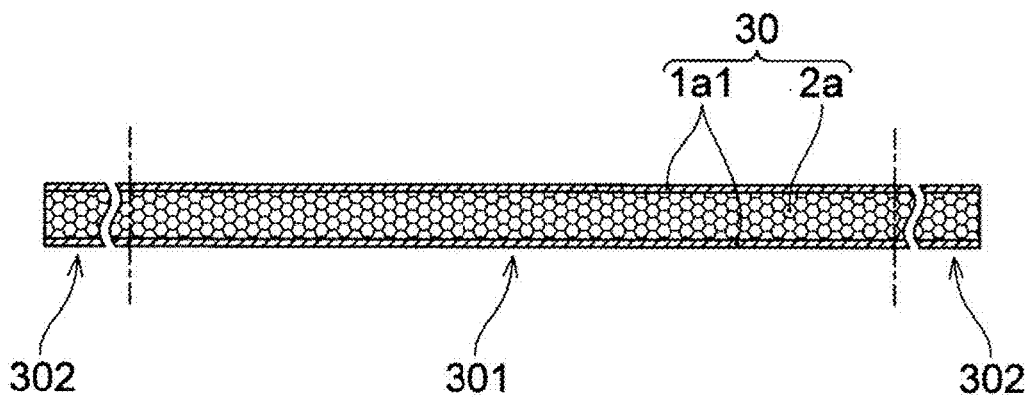
FIG. 7A is a cross-sectional view illustrating an example of a method for manufacturing a multilayer wiring substrate according to an embodiment of the present invention.

As illustrated in FIG. 7A, the method for manufacturing a multilayer wiring substrate of the present embodiment can include preparing a starting substrate 30, which is to become the core substrate 3 (see FIG. 6). In the example of FIG. 7A, an insulating plate with metal foils is prepared as the starting substrate 30, which includes: an insulating layer that is to become the insulating layer (2a) of the core substrate 3; and metal foils (1a1) that are formed of a metal such as copper and are respectively laminated on both sides of the insulating layer. As illustrated in FIG. 7A, the starting substrate 30 includes a product region 301, which forms the multilayer wiring substrate at the time of completion of the multilayer wiring substrate, and a margin region 302, which is provided on an outer side of the product region 301 and is to be removed at the time of completion of the multilayer wiring substrate.

Figure 7B:
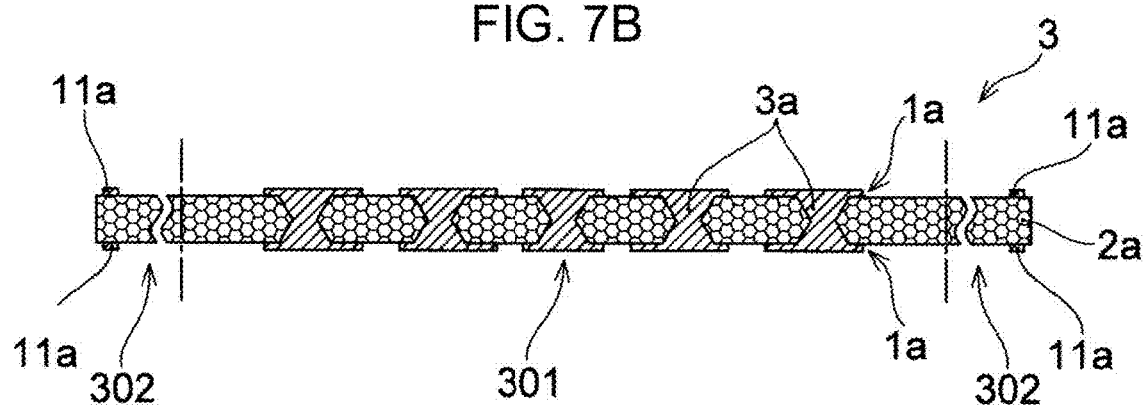
FIG. 7B is a cross-sectional view illustrating an example of a method for manufacturing a multilayer wiring substrate according to an embodiment of the present invention.

As illustrated in FIG. 7B, the conductor layers (1a), which each have predetermined conductor patterns, and the through-hole conductors (3a) are formed. In the margin region 302, reference patterns (11a) to be used in the formation of the conductor layer (1b) (to be described later) are formed along with the formation of the conductor layers (1a). It is preferable that multiple reference patterns (11a) are formed. For example, a total of four reference patterns (11a) are respectively formed at four corners of the margin region 302.

In the formation of the conductor layers (1a) and the through-hole conductors (3a), through holes are formed at formation positions of the through-hole conductors (3a), for example, by laser processing or the like. Then, on the metal foils (1a1) of FIG. 7A, for example, an electroless plating film or a sputtering film, and an electrolytic plating film, which are each formed of a metal such as copper, are formed by electroless plating or sputtering, and electrolytic plating. As a result, the conductor layers (1a) are formed, and the through-hole conductors (3a) are formed in the through holes of the insulating layer (2a). After that, the conductor layers (1a) are patterned using, for example, a tenting method. As a result, the core substrate 3 is formed that includes the conductor layers (1a), which each have desired conductor patterns, and the insulating layers (2a). For the formation of the conductor layers (1a) and the through-hole conductors (3a), a semi-additive method using copper foils may be used.

Figure 7C:
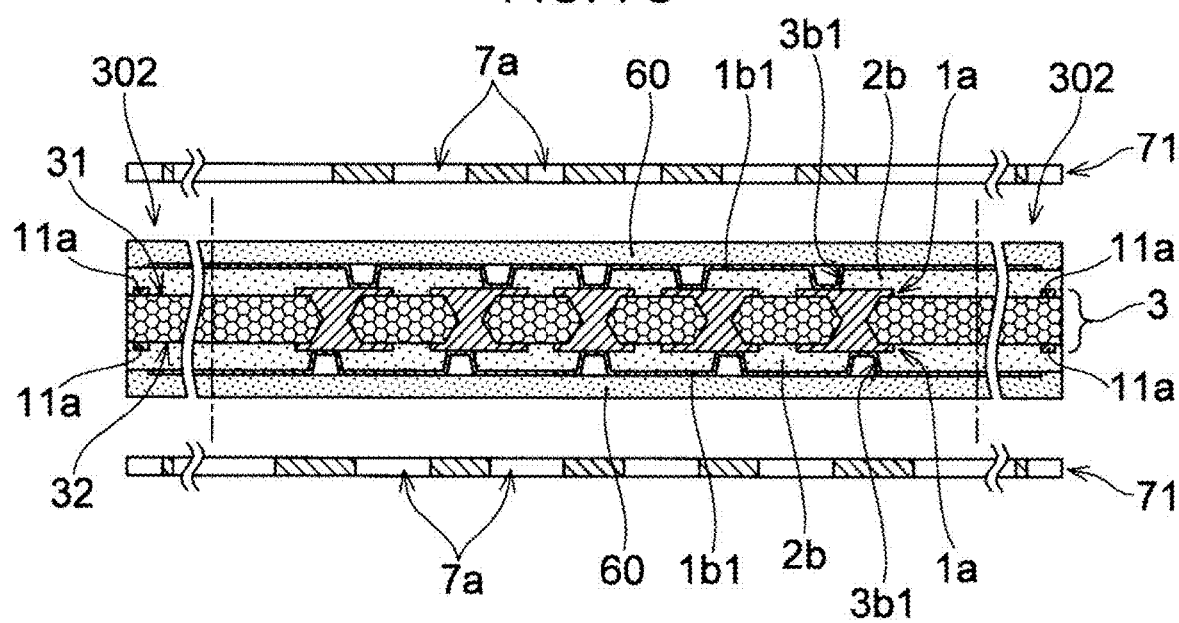
FIG. 7C is a cross-sectional view illustrating an example of a method for manufacturing a multilayer wiring substrate according to an embodiment of the present invention.

As illustrated in FIG. 7C, the insulating layers (2b) are respectively formed on the conductor layers (1a) on the first surface 31 side and the second surface 32 side of the core substrate 3. For example, the insulating layers (2b) are formed by laminating a film-like epoxy resin or prepreg on the first surface 31 and the second surface 32 of the core substrate 3 and performing thermocompression bonding. When a prepreg is used, a metal foil can be laminated together with the prepreg. Further, through holes (3b1) are formed in the formed insulating layers (2b) by laser processing or drilling.

Then, a metal film (1b1) is formed on surfaces of the insulating layers (2b) and on inner wall surfaces of the through holes (3b1) by electroless plating or sputtering. The metal film (1b1) is also formed on the surfaces of the insulating layers (2b) included in the margin region 302. However, as illustrated in FIG. 7C, portions of the metal film (1b1) that overlap the reference patterns (11a) of the conductor layers (1a) in a plan view are preferably removed by, for example, laser irradiation or the like. Therefore, positions thereof can be easily understood in a subsequent process, for example, with an X-ray camera or the like.

After the formation of the metal film (1b1), a resist film 60 is formed on an entire surface of the metal film (1b1). The resist layer 6 (to be described later) is formed by patterning the resist film 60. The resist film 60 is formed, for example, by laminating a film containing a photosensitive resin on the metal film (1b1). A resist film 60 containing a photosensitive resin may be formed by applying and drying a liquid resin on the metal film (1b1).

Then, in the example of FIG. 7C, an exposure mask 71 is prepared. The exposure mask 71 has predetermined openings (7a) according to conductor patterns to be included in a conductor layer formed on the insulating layer (2b). For example, the exposure mask 71 is prepared by performing drawing, developing, etching, and the like for a desired pattern in a light-shielding film on a glass plate using laser.

The exposure mask 71 is positioned above the resist film 60. In this case, a position and inclination of the exposure mask 71 are adjusted in order to perform the first correction and the second correction described above. For example, positions of the reference patterns (11*a*) provided in the conductor layer (1*a*) may be read using an X-ray camera (not illustrated in the drawings) or the like to determine a position and an angle at which the exposure mask 71 is to be positioned. In this way, in the present embodiment, forming the resist layer 6 may include recognizing the positions of the multiple reference patterns (11*a*) included in a conductor layer (the conductor layer (1*a*) in FIG. 7C) formed immediately before each of conductor layers to be formed using the resist layer 6. In the example of FIG. 7C, of the exposure mask 71, the position in a plan view, the inclination with respect to the resist film 60, and/or the distance from the resist film 60 are adjusted.

Then, the resist film 60 is patterned using the exposure mask 71, and as a result, the resist layer 6 (see FIG. 7D) is formed. For example, by irradiating the resist film 60 with light such as ultraviolet light via the exposure mask 71, exposure is performed, and further, development is performed. FIG. 7C is an example of a negative resist film 60, and thus, portions exposed through the openings (7*a*) of the exposure mask 71 are cured and remain even after the development. It is also possible that a positive resist film is provided, and in this case, an exposure mask is prepared in which portions where the openings (7*a*) in FIG. 7C are provided are shielded and a region other than the openings (7*a*) is opened.

Figure 7D:
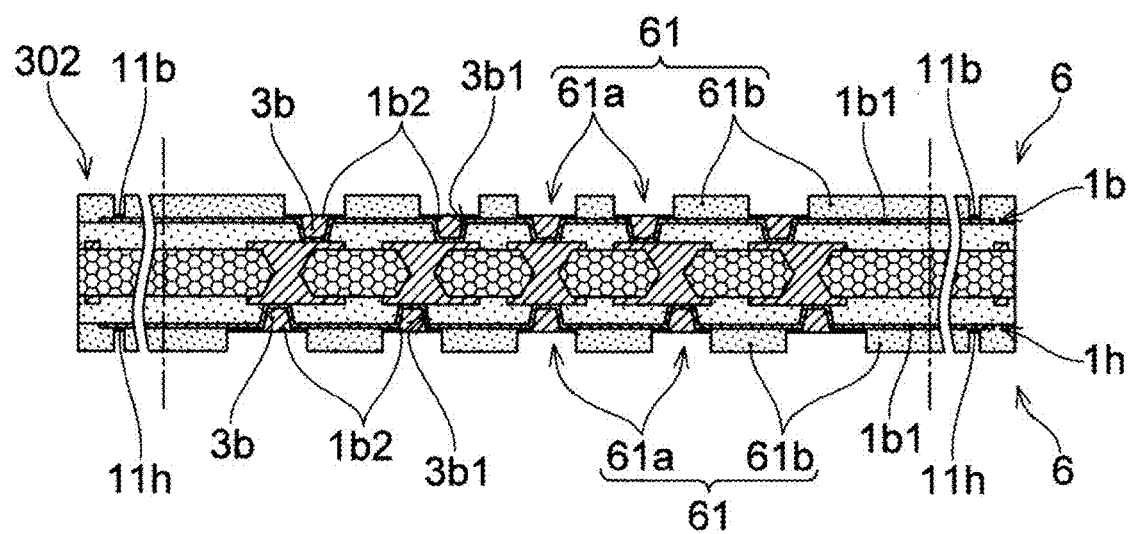
FIG. 7D is a cross-sectional view illustrating an example of a method for manufacturing a multilayer wiring substrate according to an embodiment of the present invention.

As a result of the development of the resist film 60, as illustrated in FIG. 7D, the resist layer (plating resist layer) 6 having the mask pattern 61 including the predetermined opening parts (61*a*) and the predetermined shielding parts (61*b*) is formed. Then, using the resist layer 6, the conductor layer (1*b*) and the conductor layer (1*h*), specifically, the conductor patterns of these conductor layers are formed. For example, by electrolytic plating using the metal film (1*b*1) as a power feeding layer, a plating film (1*b*2) formed of a metal such as copper or nickel is deposited in the opening parts (61*a*). As a result, the conductor patterns of the conductor layer (1*b*) and the conductor layer (1*h*) are formed, and the via conductors (3*b*) are formed in the through holes (3*b*1). In the opening parts (61*a*) of the resist layer 6 in the margin region 302, reference patterns (11*b*, 11*h*) to be used in the formation of the upper-layer conductor layers of the conductor layer (1*b*) and the conductor layer (1*h*) are formed. In the example of FIGS. 7C and 7D, in this way, the conductor layers (1*b*, 1*h*) are formed using a semi-additive method including pattern plating.

After that, the resist layer 6 is removed using an alkaline peeling agent such as sodium hydroxide, and after that, exposed portions of the metal film (1*b*1) that are not covered by the plating film (1*b*2) are removed by etching or the like. As a result, the conductor layers (1*b*, 1*h*) each including predetermined conductor patterns separated from each other are obtained.

Figure 7E:
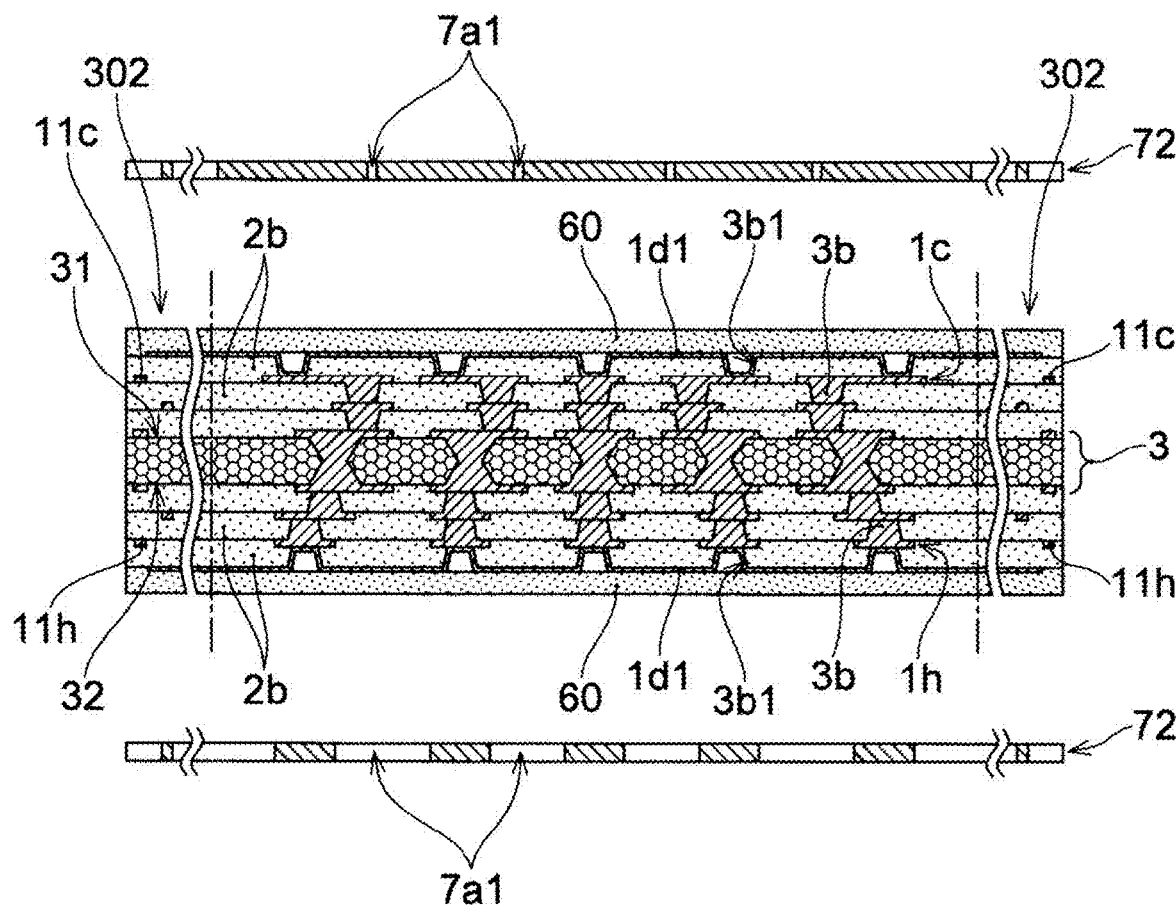
FIG. 7E is a cross-sectional view illustrating an example of a method for manufacturing a multilayer wiring substrate according to an embodiment of the present invention.

As illustrated in FIG. 7E, on the first surface 31 side of the core substrate 3, an insulating layer (2*b*) is further laminated, the conductor layer (1*c*) is formed on the insulating layer (2*b*), and the via conductors (3*b*) are formed in the insulating layer (2*b*), and an insulating layer (2*b*) is further formed on the conductor layer (1*c*). On the second surface 32 side of the core substrate 3, similarly, an insulating layer (2*b*), a conductor layer (1*h*) and via conductors (3*b*), and another insulating layer (2*b*) are further formed in this order. The insulating layers (2*b*) are each formed, for example, using a method similar to that described with reference to FIG. 7C. The conductor layer (1*c*) and the conductor layer (1*h*) and the via conductors (3*b*) are formed, for example, using a method similar to the method for forming the conductor layer (1*b*) and the via conductors (3*b*) described with reference to FIGS. 7C and 7D. That is, the first correction and the second correction may be performed in the formation of the resist layer 6 used for the formation of the conductor layer (1*c*). By performing the first correction and the second correction, it may be possible to suppress a positional deviation of the conductor layer (1*c*) with respect to the conductor patterns of the conductor layer (1*b*).

Further, through holes (3*b*1) are formed in the outermost insulating layer (2*b*) by laser irradiation, drilling, or the like, and further, a metal film (1*d*1) is formed on the surface of the insulating layer (2*b*) and inner wall surfaces of the through holes (3*b*1) by electroless plating or sputtering or the like. The metal film (1*d*1) is also formed on the surface of the insulating layer (2*b*) in the margin region 302. However, as illustrated in FIG. 7E, portions of the metal film (1*d*1) that overlap the reference patterns (11*c*) or the reference patterns (11*h*) of a conductor layer adjacent to the metal film (1*d*1) in a plan view are preferably removed by, for example, laser irradiation or the like.

After the formation of the metal film (1*d*1), a resist film 60 is formed on an entire surface of the metal film (1*d*1). The resist film 60 can be formed, for example, using a method similar to the method for forming the resist film 60 described with reference to FIG. 7C.

Then, in the example of FIG. 7E, an exposure mask 72 is prepared. The exposure mask 72 has predetermined openings (7*a*1) according to conductor patterns to be included in each of the conductor layer (1*d*) and the conductor layer (1*h*) (see FIG. 7F) formed on the outermost insulating layers (2*b*). The exposure mask 72 is prepared, for example, using the same method as that for the exposure mask 71.

The exposure mask 72 is positioned above the resist film 60. In this case, a position and inclination of the exposure mask 72 are adjusted in order to perform the first correction and the second correction described above. However, the conductor layer (1*d*) formed on the first surface 31 side of the core substrate 3 is the "specific layer" of the wiring substrate 100 of FIG. 6 as described above. Therefore, regarding the exposure mask 72 positioned on the first surface 31 side of the core substrate 3, only the position in a plan view is adjusted to perform only the first correction, and the inclination with respect to the resist film 60 and/or the distance from the resist film 60 are not adjusted. In this case, positions of the reference patterns (11*c*) provided in the conductor layer (1*c*) may be read using an X-ray camera (not illustrated in the drawings) or the like to determine a position where the exposure mask 72 is to be positioned.

On the other hand, regarding the exposure mask 72 positioned on the second surface 32 side of the core substrate 3, in addition to the position in a plan view, the inclination with respect to the resist film 60 and/or the distance from the resist film 60 can be adjusted in order to perform both the first and second corrections.

Then, the resist film 60 is patterned using the exposure mask 72, and as a result, a resist layer (6*a*) (see FIG. 7F) is formed. For example, exposure with respect to the resist film 60 via the exposure mask 72 is performed, and further, development is performed. FIG. 7E is an example of a negative resist film 60, and thus, portions exposed through the openings (7*a*1) of the exposure mask 72 are cured and remain even after the development. It is also possible that a positive resist film 60 is provided, and in this case, an exposure mask is prepared in which portions where the openings (7*a*1) in FIG. 7E are provided are shielded and a region other than the openings (7*a*1) is opened.

Figure 7F:
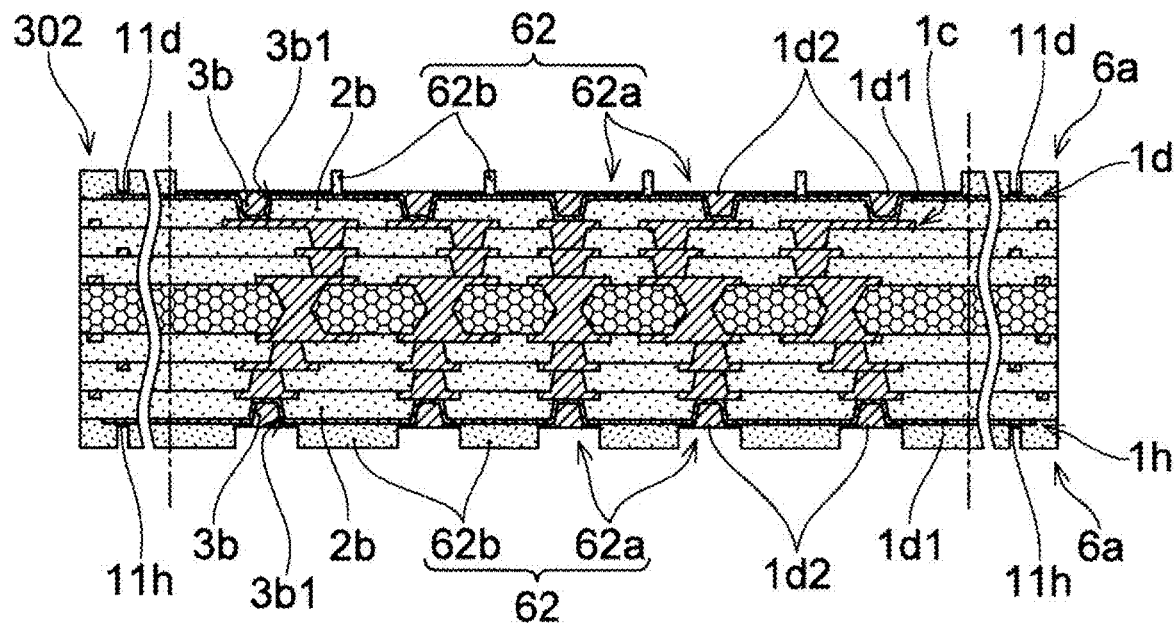
FIG. 7F is a cross-sectional view illustrating an example of a method for manufacturing a multilayer wiring substrate according to an embodiment of the present invention.

As a result of the development of the resist film 60, as illustrated in FIG. 7F, a resist layer (plating resist layer) (6*a*) having a mask pattern 62 including predetermined opening parts (62*a*) and predetermined shielding parts (62*b*) is formed. Then, using the resist layer (6*a*), the conductor layer (1*d*) and the conductor layer (1*h*), specifically, the conductor patterns of these conductor layers are formed. For example, by electrolytic plating using the metal film (1*d*1) as a power feeding layer, a plating film (1*d*2) formed of a metal such as copper or nickel is deposited in the opening parts (62*a*). As a result, the conductor patterns of the conductor layer (1*d*) and the conductor layer (1*h*) are formed, and the via conductors (3*b*) are formed in the through holes (3*b*1). In the opening parts (62*a*) of the resist layer (6*a*) in the margin region 302, reference patterns (11*d*, 11*h*) to be used in the formation of the upper-layer conductor layers of the conductor layer (1*d*) and the conductor layer (1*h*) are formed. In the example of FIGS. 7E and 7F, the conductor layer (1*d*) and the conductor layer (1*h*) are formed using a semi-additive method including pattern plating.

After that, the resist layer (6*a*) is removed using an alkaline peeling agent such as sodium hydroxide, and after that, exposed portions of the metal film (1*d*1) that are not covered by the plating film (1*d*2) are removed by etching or the like. As a result, the conductor layers (1*d*, 1*h*) each including predetermined conductor patterns separated from each other are obtained.

The conductor layer (1*d*), which is the specific layer, is formed without performing the second correction as described above. Therefore, it is considered that variation in dimensional deviation in the conductor layer (1*d*) is small. On the other hand, as described above, in the formation of the conductor layer (the conductor layer (1*c*) in FIG. 7F) formed immediately before the conductor layer (1*d*), the formation of the resist layer 6 can include performing the second correction. Therefore, it may be difficult for the conductor patterns in the conductor layer (1*d*) to sufficiently follow positions and shapes of the conductor patterns of the conductor layer (conductor layer (1*c*)) formed immediately before the conductor layer (1*d*). For example, there is a possibility that via pads provided in the conductor layer (1*d*) for the via conductors (3*b*) that connect the conductor layer (1*c*) and the conductor layer (1*d*) to each other are formed at positions that do not overlap with the via conductors (3*b*) in a plan view. Therefore, in the conductor layer (1*d*), which is the specific layer, conductor patterns such as relatively large via pads are preferably provided. By doing so, the specific layer and the conductor layer directly below the specific layer are reliably connected by, for example, the via conductors (3*b*). Therefore, in the present embodiment, forming the multiple conductor layers may include, for example, forming in the specific layer such as the conductor layer (1*d*) a conductor pattern larger than a largest conductor pattern among conductor patterns formed in multiple conductor layers other than the specific layer such as the conductor layer (1*d*).

Figure 7G:
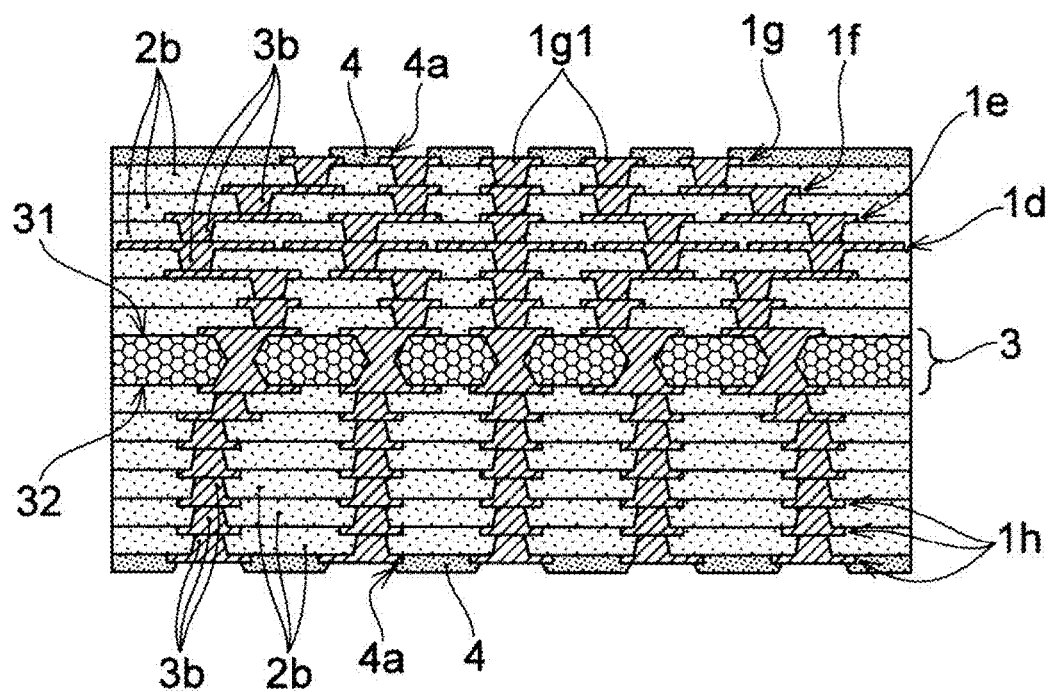
FIG. 7G is a cross-sectional view illustrating an example of a method for manufacturing a multilayer wiring substrate according to an embodiment of the present invention.

After the formation of the conductor layer (1*d*), as illustrated in FIG. 7G, on the first surface 31 side of the core substrate 3, the insulating layer (2*b*), the conductor layer (1*e*), the insulating layer (2*b*), the conductor layer (1*f*), the insulating layer (2*b*), and the conductor layer (1*g*) are further formed. On the second surface 32 side of the core substrate 3, three insulating layers (2*b*) and three conductor layers (1*h*) are further alternately formed. The via conductors (3*b*) are formed in the insulating layers (2*b*). The insulating layers (2*b*) are each formed, for example, using a method similar to that described with reference to FIG. 7C. The conductor layers (1*e*-1*h*) and the via conductors (3*b*) are formed, for example, using a method similar to the method for forming the conductor layer (1*b*) and the via conductors (3*b*) described with reference to FIGS. 7C and 7D.

In the conductor layer (1*g*), as described above, the multiple mounting pads (1*g*1) to be connected to an electronic component such as a semiconductor chip are formed. Since the mounting pads (1*g*1) to be connected to terminal pads of a semiconductor chip tend to be small, the mounting pads (1*g*1) may allow only very small variations in size and shape. On the other hand, since the conductor layers (1*b*-1*g*) are sequentially laminated on the first surface 31, which is a surface on one side of the core substrate 3, as described above, the variation in dimensional deviation of the conductor layers due to the second correction may increase toward the last formed conductor layer (1*g*) side. However, in the present embodiment, since the conductor layer (1*d*) (the specific layer) among the multiple conductor layers (1*b*-1*g*) laminated on the first surface 31 side is formed without performing the second correction, accumulation of correction amounts up to the conductor layer (1*c*) is canceled. Therefore, in the conductor layer (1*g*), which is a surface-layer conductor layer, a mounting pad (1*g*1) that exceeds in size or shape an allowable range is unlikely to be formed. Therefore, in the present embodiment, forming the multiple conductor layers may include forming a surface-layer conductor layer that includes multiple mounting pads (1*g*1) to be connected to a semiconductor chip.

After the formation of the conductor layer (1*g*), the solder resist 4 is formed on surfaces of the outermost insulating layers (2*b*) and the outermost conductor layers. The solder resist 4 is formed by, for example, applying or spraying a photosensitive epoxy resin or polyimide resin, or the like. In the solder resist 4, openings (4*a*) are formed by exposure and development. After that, the margin region 302 (see FIG. 7F) is cut off using a router or the like. Through the above processes, the multilayer wiring substrate 100 in the example of FIG. 6 is completed.

FIG. 8 illustrates a cross-sectional view of a multilayer wiring substrate 101, which is another example of a multilayer wiring substrate manufactured using the method for manufacturing a multilayer wiring substrate of the present embodiment. The multilayer wiring substrate 101 includes, on the first surface 31 side of the core substrate 3 in addition to the conductor layer (1*d*), the conductor layer (1*f*) as a conductor layer (specific layer) that is formed without performing the second correction. That is, the second correction is not performed in forming a resist layer used for forming the conductor layer (1*f*). In this way, in the method for manufacturing a multilayer wiring substrate of the present embodiment, a resist layer 6 (see FIG. 1) used for forming conductor patterns of each of two or more conductor layers among the multiple laminated conductor layers may be formed without performing the second correction. It may be possible that the variation in dimensional deviation in the outermost conductor layer among the multiple laminated conductor layers can be further reduced.

Further, in the example of FIG. 8, the conductor layer (1*e*) between the two specific layers (the conductor layer (1*d*) and the conductor layer (10) is not a specific layer, and thus, is formed through the first correction and the second correction. As described above, relatively large via pads may be formed in a specific layer. Therefore, it is considered that it is difficult to form via conductors (3b) positioned at a narrow pitch in an insulating layer (2b) formed immediately before a specific layer. Therefore, in a conductor layer formed immediately before a specific layer (for example, in FIG. 8, the conductor layer (1c) for the conductor layer (1d), and the conductor layer (1e) for the conductor layer (1f)), conductor patterns (1c1, 1e1) that can widen a spacing between via conductors (3b) may be provided.

Then, in an insulating layer (2b) laminated immediately after a specific layer is formed, a spacing between via conductors (3b) may be narrowed again. By interposing a conductor layer formed through the first and second corrections (for example, the conductor layer (1e) in FIG. 8) between two or more specific layers, it may be possible that a spacing between via conductors (3b) in an insulating layer (2b) immediately above a specific layer can be narrowed. That is, by forming a conductor layer that is not a specific layer between two or more specific layers, it may be possible that a degree of freedom in forming the via conductors (3b) is improved.

In this way, in the method for manufacturing a multilayer wiring substrate of the present embodiment, forming the multiple conductor layers may include forming at least one conductor layer between two or more conductor layers that are specific layers. Then, in forming a resist layer 6 (see FIG. 1) used for forming the conductor layer provided between the specific layers, the first correction and the second correction may be performed.

The multilayer wiring substrate 101 of FIG. 8 also includes, on the second surface 32 side of the core substrate 3, a conductor layer (1ha) as a conductor layer (specific layer) that is formed without performing the second correction. That is, the second correction is not performed in forming a resist layer 6 (see FIG. 1) used for forming the conductor layer (1ha). In this way, in the method for manufacturing a multilayer wiring substrate of the present embodiment, on both the first surface 31 side and the second surface 32 side of the core substrate 3, a conductor layer (specific layer) may be formed without performing the second correction. That is, multiple conductor layers including a specific layer (the conductor layer (1d), the conductor layer (10, or the conductor layer (1ha)) may be formed on both sides of the core substrate 3. It may be possible that not only in the surface-layer conductor layer (the conductor layer (1g)) on the first surface 31 side, but also in the outermost conductor layer (1h) on the second surface 32 side, the variation in dimensional deviation of each conductor layer due to the second correction is suppressed.

The multilayer wiring substrate 101 of FIG. 8 has the same structure as the multilayer wiring substrate 100 illustrated in FIG. 6 except that the conductor layer (1f) and the conductor layer (1ha) are included as the specific layers. A structural element of the multilayer wiring substrate 101 that is the same as a structural element of the multilayer wiring substrate 100 is indicated in FIG. 8 using the same reference numeral symbol as in FIG. 1, or is omitted as appropriate in FIG. 8, and repeated description thereof is omitted.

The method for manufacturing a wiring substrate of the embodiment is not limited the method described with reference to the drawings. For example, the conductor layers (1b-1h) may be formed using a full-additive method or a subtractive method. When a subtractive method is used, the resist layer 6 is used as an etching resist, and a copper plating film or the like exposed in the opening parts (61a) is removed by, for example, etching. Further, an insulating plate without metal foils may be prepared as the starting substrate 30, and the conductor layers (1a) and the through-hole conductors (3a), which are each formed of an electroless plating film or a sputtering film and an electrolytic plating film, may be formed. Further, the reference patterns formed in the conductor layers may be formed in the product region 301. In the method for manufacturing a multilayer wiring substrate of the embodiment, it is also possible that any process other than the processes described above is added, or some of the processes described above are omitted.

In the method disclosed in Japanese Patent Application Laid-Open Publication No. 2000-223833, in the formation of each pattern layer, an exposure mask is formed of which dimensions are corrected based on a spacing between via holes provided in a lower-layer interlayer material layer. Therefore, in order to form a pattern layer having appropriate conductor patterns for each of multilayer printed wiring boards having different shrinkage amounts, an exposure mask for each individual multilayer printed wiring board is manufactured. Therefore, manufacturing cost increases. On the other hand, when an exposure mask is shared by multiple multilayer printed wiring boards, it may be possible that conductor patterns are not accurately formed in each individual multilayer printed wiring board. As a result, it may be possible that dimensions of parts of conductor patterns of each pattern layer are not within specified value ranges.

A method for manufacturing a multilayer wiring substrate according to an embodiment of the present invention includes: forming multiple conductor layers by laminating each of the conductor layers via an insulating layer. The forming of the multiple conductor layers includes, in the formation of each of the multiple conductor layers: forming a resist layer having a mask pattern including a predetermined opening part and a predetermined shielding part; and forming a conductor pattern using the resist layer. The forming of the resist layer in the formation of the multiple conductor layers, includes: performing a first correction in which a formation position of the entire mask pattern is corrected with respect to a predetermined reference position; and performing a second correction in which a shape of the mask pattern is corrected with respect to a predetermined reference shape. The resist layer used in forming a conductor pattern of a specific layer, which is one of the second and subsequent conductor layers among the multiple conductor layers, is formed without performing the second correction.

According to an embodiment of the present invention, it is considered that a multilayer wiring substrate in which appropriately formed conductor patterns are included in conductor layers can be manufactured.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a multilayer wiring substrate, comprising:
   forming a resist layer having a mask pattern;
   forming a conductor layer having a conductor pattern using the resist layer having the mask pattern;
   removing the resist layer from the conductor layer having the conductor pattern;
   forming an insulating layer on the conductor layer such that the insulating layer is laminated on the conductor layer having the conductor pattern;

forming a subsequent resist layer having a mask pattern such that the subsequent resist layer is formed on the insulating layer; and forming a subsequent conductor layer having a conductor pattern using the subsequent resist layer having the mask pattern, wherein the forming of the resist layer includes conducting a first correction in which a formation position of an entire mask pattern of the resist layer is corrected with respect to a reference position, and conducting a second correction in which a shape of the mask pattern of the resist layer is corrected with respect to a reference shape, and the forming of the subsequent resist layer includes conducting the first correction in which a formation position of an entire mask pattern of the subsequent resist layer is corrected with respect to a reference position and does not include conducting the second correction in which a shape of the mask pattern of the subsequent resist layer is corrected with respect to a reference shape.

2. The method for manufacturing a multilayer wiring substrate according to claim 1, wherein the forming of the subsequent resist layer includes conducting the first correction.

3. The method for manufacturing a multilayer wiring substrate according to claim 1, wherein the conducting of the second correction includes correcting a shape of opening part with respect to a reference shape.

4. The method for manufacturing a multilayer wiring substrate according to claim 1, wherein the conducting of the second correction includes partially extending or contracting the mask pattern of the resist layer relative to the reference shape by a correction amount determined according to a position in the mask pattern of the resist layer.

5. The method for manufacturing a multilayer wiring substrate according to claim 4, wherein the forming of the resist layer includes recognizing a position of a reference pattern in a conductor layer formed immediately before the conductor layer, and the conducting of the second correction includes determining the correction amount for the position in the mask pattern of the resist layer based on the position of the reference pattern.

6. The method for manufacturing a multilayer wiring substrate according to claim 1, wherein the forming of the resist layer includes forming a resist film comprising a photosensitive resin, and irradiating the resist film with light via an exposure mask having an opening, and the conducting of the second correction includes tilting the exposure mask with respect to a to-be-irradiated surface of the resist film when the resist film is irradiated with light.

7. The method for manufacturing a multilayer wiring substrate according to claim 1, wherein the conductor pattern of the subsequent layer includes a ground plane or a power plane.

8. The method for manufacturing a multilayer wiring substrate according to claim 1, wherein the forming of the subsequent resist layer and the forming of the subsequent conductor layer are repeated.

9. The method for manufacturing a multilayer wiring substrate according to claim 8, wherein the forming of the resist layer and the forming of the conductor layer are repeated such that at least one conductor layer formed by the forming of the resist layer and the forming of the conductor layer is formed between two conductor layers formed by the forming of the subsequent resist layer and the forming of the subsequent conductor layer.

10. The method for manufacturing a multilayer wiring substrate according to claim 1, further comprising:

preparing a core substrate; and forming a surface-layer conductor layer including a plurality of mounting pads positioned to be connected to a semiconductor chip, wherein the conductor layer, the insulating layer and the subsequent conductor layer are laminated on the core substrate.

11. The method for manufacturing a multilayer wiring substrate according to claim 1, further comprising:

preparing a core substrate, wherein the conductor layer, the insulating layer and the subsequent conductor layer are laminated on both sides of the core substrate.

12. The method for manufacturing a multilayer wiring substrate according to claim 1, wherein the conductor pattern of the subsequent conductor layer has a largest conductor pattern in conductor patterns formed in the multilayer wiring substrate.

13. The method for manufacturing a multilayer wiring substrate according to claim 12, wherein the conducting of the second correction includes correcting a shape of opening part with respect to a reference shape.

14. The method for manufacturing a multilayer wiring substrate according to claim 12, wherein the conducting of the second correction includes partially extending or contracting the mask pattern of the resist layer relative to the reference shape by a correction amount determined according to a position in the mask pattern of the resist layer.

15. The method for manufacturing a multilayer wiring substrate according to claim 14, wherein the forming of the resist layer includes recognizing a position of a reference pattern in a conductor layer formed immediately before the conductor layer, and the conducting of the second correction includes determining the correction amount for the position in the mask pattern of the resist layer based on the position of the reference pattern.

16. The method for manufacturing a multilayer wiring substrate according to claim 12, wherein the forming of the resist layer includes forming a resist film comprising a photosensitive resin, and irradiating the resist film with light via an exposure mask having an opening, and the conducting of the second correction includes tilting the exposure mask with respect to a to-be-irradiated surface of the resist film when the resist film is irradiated with light.

17. The method for manufacturing a multilayer wiring substrate according to claim 12, wherein the conductor pattern of the subsequent layer includes a ground plane or a power plane.

18. The method for manufacturing a multilayer wiring substrate according to claim 12, wherein the forming of the subsequent resist layer and the forming of the subsequent conductor layer are repeated.

19. The method for manufacturing a multilayer wiring substrate according to claim 18, wherein the forming of the resist layer and the forming of the conductor layer are repeated such that at least one conductor layer formed by the forming of the resist layer and the forming of the conductor layer is formed between two conductor layers formed by the forming of the subsequent resist layer and the forming of the subsequent conductor layer.

20. The method for manufacturing a multilayer wiring substrate according to claim 12, further comprising:

preparing a core substrate; and forming a surface-layer conductor layer including a plurality of mounting pads positioned to be connected to a semiconductor chip,
wherein the conductor layer, the insulating layer and the subsequent conductor layer are laminated on the core substrate.

* * * * *